United States Patent [19]

Hasegawa et al.

[11] 4,168,998
[45] Sep. 25, 1979

[54] PROCESS FOR MANUFACTURING A VAPOR PHASE EPITAXIAL WAFER OF COMPOUND SEMICONDUCTOR WITHOUT CAUSING BREAKING OF WAFER BY UTILIZING A PRE-COATING OF CARBONACEOUS POWDER

[75] Inventors: Shinichi Hasegawa; Hisanori Fujita, both of Tsuchiura, Japan

[73] Assignee: Mitsubishi Monsanto Chemical Co., Tokyo, Japan

[21] Appl. No.: 966,953

[22] Filed: Dec. 6, 1978

[51] Int. Cl.² ............... H01L 21/205; H01L 21/302
[52] U.S. Cl. .................................. 148/175; 148/174; 156/612; 219/10.49 R; 219/10.67; 427/87; 427/248 R; 427/299; 118/719
[58] Field of Search ............... 148/174, 175; 156/612; 118/48, 49.5; 219/10.49, 10.67; 427/87, 248 R, 299

[56] References Cited

U.S. PATENT DOCUMENTS

| | | | |
|---|---|---|---|
| 3,436,255 | 4/1969 | Harris et al. | 156/612 X |
| 3,549,847 | 12/1970 | Clark et al. | 219/10.49 |
| 3,796,182 | 3/1974 | Rosler | 118/48 |
| 3,845,738 | 11/1974 | Berkman et al. | 219/10.49 X |
| 3,980,854 | 9/1976 | Berkman et al. | 219/10.49 |

OTHER PUBLICATIONS

Luther, L. C., "Bulk Growth of GaP by Halogen Vapor Transport", Metallurgical Transactions, vol. 1, Mar. 1970, pp. 593–601.
Goemans et al., "Control of Slip . . . with Profiled Susceptors", J. Crystal Growth, vol. 31, 1975, pp. 308–311.
Burd, J. W., "Multi-Wafer Growth System . . . $GaAs_{1-x}P_x$", Transactions Metallurgical Soc. Aime, vol. 245, Mar. 1969, p. 573.
Shaw, D. W., "Effects of Vapor Composition . . . Gallium Arsenine . . .", J. Electrochem. Soc., Solid State Science, vol. 115, No. 7, Jul. 1968, p. 778.

Primary Examiner—R. Dean
Assistant Examiner—W. G. Saba
Attorney, Agent, or Firm—Burgess, Ryan and Wayne

[57] ABSTRACT

Semiconductor epitaxial wafers consisting of an epitaxial film and its substrate can be removed, in accordance with the present invention, from a substrate supporting component, without breaking the wafers into pieces after completion of vapor growth. The carbonaceous powder according to the present invention can greatly and effectively decrease the breaking of wafers, as compared with the conventional $SiO_2$ or SiC-coated substrate supporting components.

13 Claims, 6 Drawing Figures

PROCESS FOR MANUFACTURING A VAPOR PHASE EPITAXIAL WAFER OF COMPOUND SEMICONDUCTOR WITHOUT CAUSING BREAKING OF WAFER BY UTILIZING A PRE-COATING OF CARBONACEOUS POWDER

The present invention generally relates to a process for producing an epitaxially grown film of a compound semiconductor, and more particularly to a vapor growth process for producing a compound semiconductor consisting of elements from the III and V groups of the periodic table (hereinafter referred to as the III-V compound semiconductor), as well as a compound semiconductor consisting of elements from the II and VI groups of the periodic table (hereinafter referred to as the II-VI compound semiconductor). The III-V compound semiconductors having the zinc blende type crystal structure, such as gallium arsenide (GaAs), gallium phosphide (GaP) and the like, are extensively used as elements of FET's (field effect transistors) for microwave transmission, and as elements of an ultraviolet infrared or visible light-emitting diode. These elements are produced by forming an epitaxial film(s) of gallium arsenide (GaAs), gallium phosphide (GaP) and the like on a substrate of a single crystalline semiconductor material. For example, the visible light emitting diode can be produced from a vapor-phase epitaxially grown film(s) of a gallium phospho-arsenide having the formula of $GaAs_{1-x}P_x$, wherein $0 < x < 1$, or an epitaxial film of gallium phosphide on a substrate, which consists of gallium phosphide or gallium arsenide having the zinc blende type crystal structure, or which consists of group IV semiconductive germanium body having a diamond-type crystal structure.

In the conventional epitaxial growth process of the compound semiconductor, by means of the vapor growth, at least one single crystalline semiconductor substrate suited for the epitaxial growth of a film thereon is supported by a supporting component of the vapor growth apparatus. The term "the single crystalline semiconductor substrate" used above will hereinafter be shortened to the term "substrate". The substrate is very thin and generally has a thickness of from 250 to 350 microns. The supporting member mentioned above is referred to in the art of the semiconductor industry as a susceptor, base, substrate holder, substrate carrier or pedestal. However, hereinafter, the member for supporting or carrying at least one semiconductor substrate will not be referred to by using the various known designations, but will be referred to by using the collective term of supporting component.

In the conventional vapor growth process of growing an epitaxial film consisting of the compound semiconductor, the substrate(s) is placed on the surface of the supporting component, and the supporting component with the substrate(s) is inserted into the epitaxial reaction vessel of the vapor growth apparatus. The supporting component can consist of such materials as quartz of a high purity or carbon. The carbon in a powder form is sintered so as to produce the supporting component and also so that the graphitization of carbon can take place during the sintering process.

A highly pure quartz, a thermally decomposed graphite, a silicon carbide (SiC), or a silicon dioxide ($SiO_2$) made by a vapor-phase thermal decomposition process may be applied as the coating layer on the supporting component in the form of a block.

When the above-mentioned vapor growth process was carried out, the Inventors encountered a problem during the step of removing a wafer from the conventional supporting component. The term "wafer" mentioned above will be defined here as a material which consists of an epitaxial film and its substrate. The aforementioned problem was due to the fact that the substrate(s) of the wafer or the edge of the epitaxial film of the wafer became bonded to the contact surface of the supporting component during the vapor growth procedure. As a result, it was disadvantageously necessary to divide every wafer containing the epitaxially grown film on the substrate into two or three pieces before removal of the wafer(s) from the supporting component. It was also found by the Inventors that the epitaxial film of the III-V compound semiconductor containing phosphorus, such as gallium phospho-arsenide ($GaAs_{1-x}P_x$), tended to strongly bond with the supporting component and was thus caused to break into pieces, when the phosphorus content "x" was increased from 0 to 1. In addition, when a substrate of the III-V compound containing phosphorus was used, the above-mentioned tendency of bonding and breaking was even more remarkable as compared with the case wherein gallium arsenide or germanium was used for the substrate.

It is therefore an object of the present invention to provide a process for the vapor growth of an epitaxial film of a compound semiconductor in which breaking of the wafer(s) having the deposited epitaxial film is substantially decreased when the wafer(s) is removed from the top surface of the component of the vapor growth apparatus for supporting the substrates.

In accordance with the object of the present invention, there is provided a process for producing an epitaxially grown film of a compound semiconductor on at least one semiconductor substrate, comprising the steps of:

applying a powder, which essentially consists of carbon, on either or both of (1) the back surface of the above-mentioned at least one semiconductor substrate whose back surface will come in contact with the top surface of a supporting component of a vapor growth apparatus and (2) the top surface of the supporting component whose top surface will come in contact with the back surface of the substrate;

placing at least one substrate on the component for supporting the substrate in such a manner that the film formed by application of the powder is interposed between at least one substrate and the supporting component of the substrate; and bringing a reaction gas for the vapor growth into contact with the exposed top surface of at least one semiconductor substrate.

The film of powder consisting essentially of carbon is preliminarily and contiguously interposed between the unexposed back surface of the semiconductor substrate(s) and the top surface of the supporting component; subsequently, the compound semiconductor is deposited on the exposed top surface of the semiconductor substrate. Consequently, the wafer consisting of the semiconductor substrate(s) together with the epitaxial film can be removed thereafter without causing the wafer(s) to break into fragments or pieces.

The powder consisting essentially of carbon, hereinafter referred to as a carbonaceous powder, is advantageously produced from the incomplete combustion of at least one combustible hydrocabonaceous compound.

The term "combustible hydrocarbonaceous compound" used herein designates an organic compound, which essentially consists of hydrocarbon radicals and which is adapted to form smoke or soot by incomplete combustion thereof. The hydrocarbonaceous compound can include a hydrocarbon, an alcohol, a fatty acid or an ester of a fatty acid. The most preferable hydrocarbon(s) for easily forming the smoke is at least one member selected from the aromatic hydrocarbon group with a high carbon content consisting of benzene, toluene, xylene, naphthalene, methylnaphthalene and tetralin (tetrahydro-naphthalene). The combustible hydrocarbonaceous compound which may be used in the present invention includes (1) paraffin hydrocarbons, such as propane, butane, hexane, octane, isooctane or solid paraffin, (2) a compound containing oxygen, such as methanol, ethanol or acetone, and (3) vegetable or animal fats and oils, such as soybean oil or fish oil, (4) olefin hydrocarbons, such as ethylene, propylene and styrene, and (5) high polymers of olefin hydrocarbons.

The group of the above-mentioned hydrocarbonaceous compounds, which are liquid at room temperature, is generally burned by igniting a lamp wick which consists of vegetable or mineral fibers, such as cotton, asbestos, or glass fibers and which is soaked with such hydrocarbonaceous compounds. The group of hydrocarbonaceous compounds such as propane and butane, which are gaseous at room temperature, can be burned in a combustion device with an adjustable air supply such as a Bunsen burner, so that the amount of smoke can be controlled to that necessary for carrying out the process of the present invention. The group of hydrocarbonaceous compounds such as solid paraffin, which are solid at room temperature, is generally burned, e.g., as candles, by arranging a solid hydrocarbonaceous compound around a wick composed of vegetable or mineral fibers, such as cotton, asbestos or glass fibers.

The back surface of the substrate(s) and/or the top (front) surface of the supporting component, on which the soot is to be deposited, is brought into contact with the combustion flame of the hydrocarbonaceous compound, thereby depositing on such surface a layer of soot, which may contain a trace amount of species having a high boiling point, for example, tar.

The carbonaceous powder, which is already prepared as carbon black or graphite powders, may be directly deposited in the form of a film on the surface of the substrate(s) and/or the supporting component for the substrate(s). The prepared carbonaceous powder as mentioned above has a grain size of preferably 300 microns or less in diameter.

When the sintered amorphous carbon powder or sintered graphite powder is used for the supporting component, the surface of the supporting component may be worked or ground by sand lapping, sand abrading and the like, thereby forming the carbonaceous powder in the form of a film on the surface of the supporting component.

The thickness of the carbonaceous powder film to be deposited on the surface of the substrate(s) and/or the supporting component of the substrate(s) is preferably in the range of from 50 to 300 microns in total, but may be greater or less than this range.

The compound semiconductors used for forming the epitaxial film are (1) III-V compound semiconductor, such as gallium arsenide (GaAs), gallium phosphide (GaP), gallium phospho-arsenide ($GaAs_{1-x}P_x$), indium phosphide (InP), gallium indium phosphide ($Ga_yIn_{1-y}P$), gallium-indium phosphoarsenide ($Ga_yIn_{1-y}As_{1-x}P_x$), indium phosphoarsenide ($InAs_{1-x}P_x$) and the like, and (2) II-VI compound semiconductor such as zinc sulfide (ZnS), cadmium sulfide (CdS), zinc telluride (ZnTe), cadmium telluride (CdTe) and the like.

For obtaining an epitaxial layer consisting of a III-V compound semiconductor, particularly of a III-V compound semiconductor containing phosphorus, it is preferable to employ the process according to the present invention.

A single crystal of the III-V compound semiconductor or the II-VI compound semiconductor, or of the IV group element semiconductor, such as germanium, silicon and the like, is cut in the form of a thin wafer and is used as the substrate.

The material for forming the supporting component of the substrate(s) may be of any known materials, such as the above-mentioned high-purity quartz and the like.

The epitaxial film is produced by means of a known vapor growth system. The vapor growth system usually employed for forming the III-V compound semiconductor and the II-VI compounds semiconductor is therefore adaptable for use in the present invention. Such known system generally includes the steps of: (1) generating a volatile group III (Ga) component by vaporizing or reacting a reaction gas (halide of group V element or HCl) with the group III element or compound, (2) introducing the V component (As) into the volatile III component, if necessary, and (3) transferring and depositing the III-V compound on the heated substrate(s).

The present invention will now be explained in detail in comparison with the prior art and with reference to the accompanying drawings, wherein.

Figure 3:
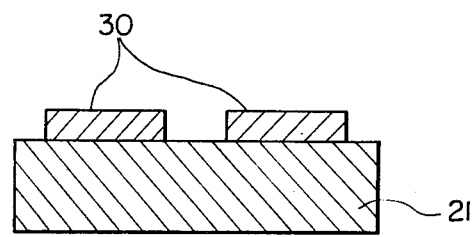
Figure 4:
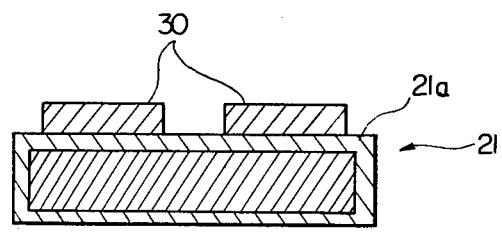
Figure 5:
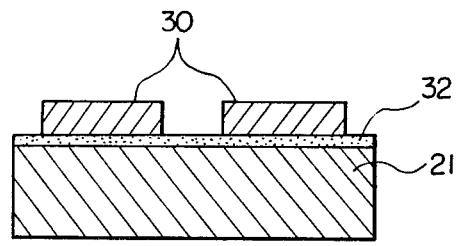
Figure 6:
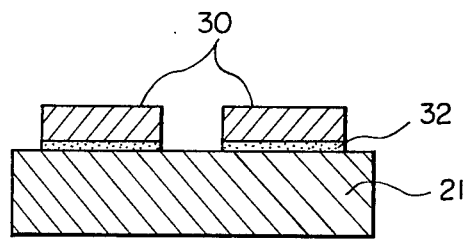

FIGS. 3 and 4 are schematic views of the substrates and a supporting component used in the conventional process for vapor growing a compound semiconductor; and FIGS. 5 and 6 are views which are similar to FIGS. 4 and 5 but which show a film of carbonaceous powder used in accordance with the present invention.

Figure 1:
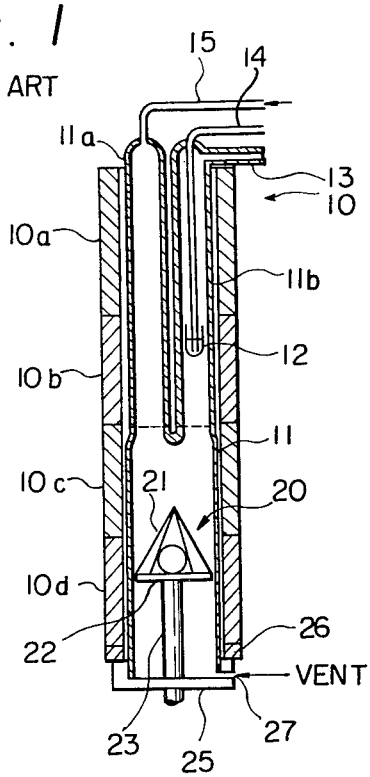
FIG. 1 is a cross-sectional view of a conventional, vertical-type vapor growth apparatus, in which the process according to the present invention can be performed.

FIG. 1 schematically illustrates a prior art vertical vapor growth furnace, which is similar to that recited in "A Multi-Wafer Growth System for the Epitaxial Deposition of GaAs and $GaAs_{1-x}P_x$", John W. Burd, TRANSACTIONS OF THE METALLURGICAL SOCIETY OF AIME, Volume 245, March, 1969, page 573. In FIG. 1, a furnace 10 consists of four vertically mounted tubes 10a, 10b, 10c and 10d and is provided with a separate resistance heating means (not shown). A silica tube 11 is accommodated within the furnace 10, and the upper portion of the silica tube 11 is split into two parallel sections 11a and 11b. A gallium reservoir 12 is positioned within the second zone 10b and in the split section 11b, at which section end a tube 13 for a carrier gas, for example, H₂ gas, is terminated. A tube 14 protruding through the split section 11b and entering into the gallium melt in the reservoir 12 is used for feeding HCl gas into the reservoir 12 so as to form GaCl, which is then transferred downwards by the carrier gas from the carrier gas tube 13. A tube 15 is terminated at the end of the split tube 11a and used to feed a gaseous compound of the V group compound(s) such as PH$_3$ and AsH$_3$ into the split tube 11a, and to occasionally feed a dopant gas into the furnace 10. The reaction between the GaCl and either or both of PH$_3$ and AsH$_3$, therefore, takes place in the tube 10c.

A component 20 for supporting the substrate(s) (not shown) is accommodated in the quartz tube 11. The supporting component 20 consists of quartz plates 21, base 22 for mounting the quartz plates 21 and a quartz rod 23, which is connected to the base 22 and which rotatably protrudes through the bottom 25 of the furnace 10. The quartz plates are, for example, eight triangular shaped pieces which are joined together to form a pyramid shaped supporting body of the supporting component 20.

The bottom plate 25 of the furnace 10 can be disassembled from the position shown in FIG. 1. After disassembly, each substrate (not shown) is placed flatly on each flat surface of the triangular shaped plate so as to be contiguous therewith, on which plate the film of carbonaceous powder was previously formed. An appropriate seal means 26 is fitted on the lower end of the furnace tube 10d and a vent 27 is provided between the seal means 26 and the bottom plate 25. The inner space of the furnace 10 is maintained under a reducing atmosphere.

After completion of the vapor growth, the supporting component 20 together with the substrates is disassembled from the vapor growth furnace 10. The substrates are then removed from the supporting surface of the quartz plate 21 by clipping the edge of the substrates while using a clipping means such as pincers.

The substrate(s) is positioned at right angles to or inclined to the vertical line, which passes through the vertical-type vapor growth apparatus for forming a compound semiconductor, in which apparatus the volatile group III-V components are caused to flow vertically in the vapor growth furnace.

The supporting component mentioned above, however, can also be employed for the horizontal-type vapor growth of a compound semiconductor.

Figure 2:
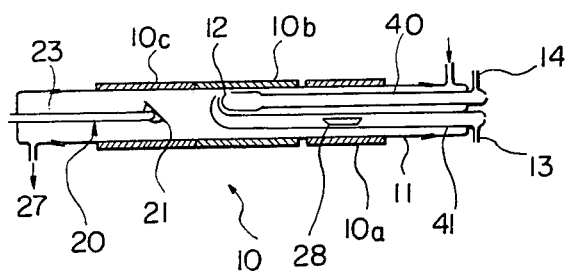
FIG. 2 is a cross-sectional view of a conventional, horizontal-type vapor growth apparatus, in which the process according to the present inventions can also be performed.

FIG. 2 schematically illustrates a prior art horizontal vapor growth furnace, which is similar to that recited in "Effects of Vapor Composition on the Growth Rates of Faced Gallium Arsenide Hole Deposits", Don W. Shaw, J. Electrochem. Soc., SOLID STATE SCIENCE, Volume 115, No. 7, July, 1968, page 778.

The prior art horizontal vapor growth furnace consists of three horizontal tubes 10a, 10b and 10c and is provided with a separte heating means (not shown). An arsenide reservoir or boat 28 and a gallium reservoir or boat 12, are accommodated in the tubes 10a and 10b, respectively, while substrate(s) (not shown) which is supported by a supporting component 20, is accommodated in the tube 10c. The supporting component 20 consists of a movable rod 23 and an inclined supporting plate 21. A quartz tube 11 is inserted into the furnace 10 for defining a reaction chamber therein. GaAs is formed in the reaction chamber and then deposited on the substrate(s). A tube 40 is accommodated in the tube 11 for defining a space therein. Gallium in the boat 12 is reacted in the tube 40 with hydrogen chloride gas supplied from the tube 14. A tube 41 is accommodated in the tube 11 for defining a space therein. Arsenide in the reservoir 28 is transported in the tube 41 by a hydrogen gas (supplied from a tube 13) into the reaction chamber in the horizontal tube 10c.

The substrate(s) can be positioned horizontally or in an inclined manner in the horizontal vapor growth apparatus.

When substrates 30 (FIG. 3) are directly placed on the plate 21 (made of a high-purity quartz, silicon carbide, graphite and the like) of the supporting component, or when the substrates 30 (FIG. 4) are directly placed on the plate 21 provided with the silicon dioxide coating 21a in accordance with the conventional process, during their removal from the plate 21, a large percentage, for example, approximately 86% of the wafers is broken into fragments. On the other hand, according to the present invention, as seen in FIGS. 5 and 6, since the carbonaceous powder film 32 is present between the back surface of the substrates 30 and the top (front) surface of the supporting plate 21, the percentage of broken wafers is considerably reduced to, for example, approximately 3% or less. As understood from FIGS. 5 and 6, the carbonaceous powder film 32 may be formed on the top (front) surface of the supporting plate 21 or on the back surface of the substrate 30.

As can be seen from the above description, the present invention can remarkably prevent breakages of wafers consisting of substrates together with epitaxial films; thus, the present invention is very useful in the semiconductor industry.

The present invention is explained in detail by means of the following Examples.

EXAMPLE 1

Xylene instead of alcohol was poured into an alcohol lamp used generally for chemical experiments. Upon ignition, xylene was burned and a large amount of soot produced by the flame was deposited on the top (front) surface of each high-purity quartz plates 21 of the supporting component thus forming a carbonaceous powder film having a thickness of approximately 150 microns.

The vapor growth apparatus used had a structure as shown in FIG. 1. The inner diameter and the length of the quartz tube 11 were 80 mm and 950 mm, respectively. The ten substrates, each of which is a (100) plane and consisting of sulfur-doped, gallium phosphide (GaP), had a thickness of 300 microns, a diameter of 30 mm and an offset angle of 5° from the <100> direction.

The vapor growth conditions of GaAs$_{1-x}$P$_x$ (X=0.65) were as follows.

1. The source material contained in the reservoir 12 was high-purity gallium.
2. The flow rate of HCl gas fed from the tube 13 was 50 cc/min during the entire period of GaAs$_{0.35}$P$_{0.65}$ vapor growth. The period consisted of a composition-grading stage and a composition-constant stage.
3. The flow rate of AsH$_3$ gas fed from the tube 15 was changed from 0 cc/min to 14 cc/min during the above composition-grading stage of the vapor growth and, thereafter, the flow rate of 14 cc/min was fixed during the remaining composition-constant stage of the vapor growth.
4. The flow rate of PH$_3$ gas fed from the tube 15 was changed from 40 cc/min to 26 cc/min during the aforementioned composition-grading stage of the vapor growth and, thereafter, the flow rate of 26 cc/min was fixed during the remaining composition-constant stage of the vapor growth.

5. The flow rate of $H_2$ gas fed from the tube 13 and the flow rate of $H_2$ gas fed from the tube 15 were 50 cc/min and 1500 cc/min, respectively, during the entire period of vapor growth.

6. The flow rate of $NH_3$ gas fed from the tube 15 was 200 cc/min during the composition-constant stage of the vapor growth.

7. The heating temperature of the gallium was 750° C.

8. The heating temperature of the substrates was 860° C.

After completion of the vapor growth, the $GaAs_{1-x}P_x$ wafers ($x=0.65$) having a thickness of 430 microns were removed from the supporting plates 21.

The above-mentioned procedure was repeated twice, and ten substrates each time or twenty substrates in total were subjected to the formation of the epitaxial film and then removed from the supporting plates 21. All of the wafers could be easily removed from the supporting plates, and no wafers were found to be broken into pieces at all.

EXAMPLE 2

The same procedure as in Example 1 was repeated, except that the soot generated from the combustion of xylene was deposited on one surface of each of the GaP substrates to form a carbonaceous powder film having a thickness of 150 microns. Each time, ten substrates were placed on the supporting plate 21 of the supporting component 20 so that the carbonaceous powder film was deposited on the lower surface of the reversed substrate.

Twenty wafers 30 in total were removed from the supporting plate 21 after completion of the vapor growth. Only one wafer was found to be broken into pieces during removal.

EXAMPLE 3

Five commercially available candles made of solid paraffin were bundled together and then ignited. A large amount of soot generated by the flame was deposited on the surface of the supporting component made of a high-purity quartz to form a carbonaceous film having a thickness of approximately 150 microns. The ten (100) plane substrates used, each consisting of sulfur-doped, gallium phosphide (GaP) had an offset angle of 4° from the <100> direction.

The same vapor growth apparatus, and procedure as in Example 1 were employed in the present example.

The vapor growth conditions of GaP were as follows.

1. Source material contained in the reservoir 12: high-purity gallium.
2. Flow rate of HCl gas fed from the tube 13: 50 cc/min.
3. Flow rate of $PH_3$ gas fed from the tube 15: 40 cc/min.
4. Flow rate of $H_2$ gas fed from the tube 13: 50 cc/min.
5. Flow rate of $H_2$ gas fed from the tube 15: 1500 cc/min.
6. Heating temperature of the gallium: 750° C.
7. Heating temperature of the substrates: 880° C.

After completion of the vapor growth, the GaP wafers having a thickness of 420 microns were removed from the supporting plates 21.

The procedure mentioned above was repeated twice, and ten substrates at each time or twenty substrates in total were subjected to the formation of the epitaxial film and then removed from the supporting plates 21. All of the wafers could be easily removed from the supporting plates and no wafers were found to be broken into pieces at all.

EXAMPLE 4

The same procedure as in Example 3 was repeated, except that soot was deposited on one back surface of each of the Gap substrates to form a carbonaceous powder film having a thickness of 150 microns. Each time, ten substrates were placed on the supporting plate 21 of the supporting component 20 so that the carbonaceous powder film deposited on the surface thereof could be in contact with the supporting component of the high-purity quartz.

Twenty wafers in total were removed from the supporting plate 21. Two wafers were broken into pieces during removal.

Control Example 1

The procedure of Example 1 was repeated with regard to ten GaP substrates, except that no carbonaceous powder was deposited on the supporting component made of a high-purity quartz. Eight of the ten $GaAs_{1-x}P_x$ epitaxial wafers were broken when the wafers were removed from the supporting component.

Control Example 2

Instead of the high-purity in Control Example 1, the supporting component was made of sintered carbon powder and carbon powder treated by graphitization heating. The procedure of the Control Example 1 was repeated. As a result, all of the ten wafers were broken when the wafers were removed from the supporting component.

Control Example 3

Instead of the high-purity quartz in Control Example 1, a graphite, supporting component produced by the graphitization heating carbon powder was coated with a layer of silicon carbide. The procedure of Control Example 1 was repeated. As a result, nine of the ten wafers were broken when the wafers were removed from the supporting component.

Control Example 4

The silicon dioxide coating layer was applied on the supporting component of Control Example 1, by using a vapor phase deposition method, and the procedure of Control Example 1 was repeated. As a result, seven of the ten wafers were broken when the wafers were removed from the supporting component after completion of the vapor growth.

Control Example 5

The procedure of Example 3 was carried out to form an epitaxial layer on each of ten substrates. The procedure used in the present Control Example was the same as that used in Example 3, except that a graphite supporting component produced by graphitization heating of carbon powder was employed and, furthermore, no carbonaceous powder was applied on the surface of the supporting component.

All of the ten wafers were broken when the wafers with the gallium phosphide (GaP) epitaxial layer were removed from the supporting component.

Control Example 6

The same procedure as in Control Example 5 was repeated, except that the supporting component was coated with a high-purity quartz layer.

Eight of the ten wafers with the gallium phosphide (GaP) epitaxial layer were broken when the wafers were removed from the supporting component.

Control Example 7

The same procedure as in Control Example 5 was repeated, except that the graphite supporting component was coated with a silicon carbide layer.

Nine of the ten wafers with the gallium phosphide (GaP) epitaxial layer were broken when the wafers were removed from the supporting component.

Control Example 8

The same procedure as in Control Example 5 was repeated except that the graphite supporting component was coated with a silicon dioxide layer which was deposited by means of a vapor phase deposition method.

Eight of the ten wafers with the gallium phosphide (GaP) epitaxial layer were broken when the wafers were removed from the supporting component.

The results of the all of the Examples, above, are summarized in the following table.

Table

|  | Number of Total Substrates | Number of Broken Wafers | Epitaxial Film |
|---|---|---|---|
| Example 1 | 20 | 0 | $GaAs_{1-x}P_x$ |
| 2 | 20 | 1 | " |
| 3 | 20 | 0 | GaP |
| 4 | 20 | 2 | " |
| Total | 80 | 3 |  |
| Control Example 1 | 10 | 8 | $GaAs_{1-x}P_x$ |
| 2 | 10 | 10 | " |
| 3 | 10 | 9 | " |
| 4 | 10 | 7 | " |
| 5 | 10 | 10 | GaP |
| 6 | 10 | 8 | " |
| 7 | 10 | 9 | " |
| 8 | 10 | 8 | " |
| Total | 80 | 69 |  |

What we claim is:

1. A process for producing an epitaxially grown film of a compound semiconductor on at least one semiconductor substrate, comprising the steps of:
    applying a powder, which consists essentially of carbon, on at least one of a back surface of said at least one semiconductor substrate and a top surface of a supporting component of a vapor growth apparatus, said back surface will come in contact with said top surface through said applied powder;
    placing said at least one substrate on said component for supporting the substrate in such a manner that the film formed by said application of said powder is interposed between said at least one substrate and said supporting component of said substrate; and
    bringing a reaction gas for the vapor growth into contact with the exposed surface of said at least one semiconductor substrate supported by said component.

2. A process according to claim 1, wherein said step of applying a powder consisting essentially of carbon comprises an incomplete combustion of at least one combustible hydrocarbonaceous compound, thereby generating a soot as said powder consisting essentially of carbon.

3. A process according to claim 2, wherein the flame of said combustible hydrocarbonaceous compound during incomplete combustion thereof is contacted with said at least one of (1) said back surface of said at least one semiconductor substrate and (2) said top surface of a component of a vapor growth apparatus for supporting said substrate.

4. A process according to claim 1, wherein said step of applying a powder consisting essentially of carbon comprises depositing a pre-prepared carbonaceous powder.

5. A process according to claim 1, wherein said component consists of carbon and said step of applying a powder consisting essentially of carbon comprises grinding said top surface of said component for supporting the substrate, thereby forming on said component a carbonaceous powder film.

6. A process according to claim 1, wherein the total thickness of said film formed by said application of powder ranges from 50 to 300 microns.

7. A process according to claim 1, wherein said compound semiconductor consists of elements from the III and V groups of the periodic table.

8. A process according to claim 7, wherein said compound semiconductor comprises phosphorus.

9. A process according to claim 7, wherein said compound semiconductor is gallium arsenide.

10. A process according to claim 8, wherein said compound semiconductor is gallium phosphoarsenide.

11. A process according to claim 1, wherein said process further comprises the step of:
    between said step of placing at least one substrate and said step of bringing a reaction gas into contact with said exposed top surface, mounting said supporting component in a vertical-type vapor growth apparatus.

12. A process according to claim 1, wherein said process further comprises the step of:
    between said step of placing said at least one substrate and said step of bring a reaction gas into contact with said exposed top surface, mounting said supporting component in a horizontal-type vapor growth apparatus.

13. A process according to claim 1, wherein said process further comprises the step of:
    after said step of bringing a reaction gas into contact with said exposed top surface, clipping the edge of each of said at least one wafer consisting of a vapor-grown epitaxial film and its substrate, and removing said wafer from said supporting component.

* * * * *

UNITED STATES PATENT AND TRADEMARK OFFICE
CERTIFICATE OF CORRECTION

PATENT NO. : 4,168,998
DATED : September 25, 1979
INVENTOR(S) : Shinichi Hasegawa, et al It is certified that error appears in the above—identified patent and that said Letters Patent is hereby corrected as shown below:

Column 5, line 53: "separte" should be --separate--.

Column 8, line 7: "Gap" should be --GaP--.

Column 10, line 50: "bring" should be --bringing--.

Signed and Sealed this

Twenty-second Day of April 1980

[SEAL]

Attest:

SIDNEY A. DIAMOND

Attesting Officer

Commissioner of Patents and Trademarks